(12) United States Patent
Kobayashi et al.

(10) Patent No.: US 8,299,925 B2
(45) Date of Patent: Oct. 30, 2012

(54) RFID TAG AND MANUFACTURING METHOD THEREOF

(75) Inventors: Hiroshi Kobayashi, Kawasaki (JP); Kenji Kobae, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 154 days.

(21) Appl. No.: 12/180,117

(22) Filed: Jul. 25, 2008

(65) Prior Publication Data
US 2009/0109000 A1 Apr. 30, 2009

(30) Foreign Application Priority Data
Oct. 26, 2007 (JP) .................................. 2007-279346

(51) Int. Cl.
G08B 13/14 (2006.01)
H01R 43/00 (2006.01)
B44C 1/165 (2006.01)
H01L 23/02 (2006.01)
H01L 23/52 (2006.01)

(52) U.S. Cl. ......... 340/572.1; 29/825; 29/846; 156/230; 257/686; 257/777

(58) Field of Classification Search ................ 340/572.8
See application file for complete search history.

(56) References Cited

U.S. PATENT DOCUMENTS

| | | | |
|---|---|---|---|
| 6,271,801 B2 * | 8/2001 | Tuttle et al. | 343/872 |
| 6,365,963 B1 * | 4/2002 | Shimada | 257/686 |
| 6,422,473 B1 | 7/2002 | Ikefuji et al. | |
| 6,489,669 B2 | 12/2002 | Shimada et al. | |
| 6,743,319 B2 * | 6/2004 | Kydd | 156/230 |
| 7,166,924 B2 * | 1/2007 | Lu et al. | 257/777 |
| RE40,137 E * | 3/2008 | Tuttle et al. | 438/19 |
| 7,468,774 B2 | 12/2008 | Sakama et al. | |
| 7,542,301 B1 * | 6/2009 | Liong et al. | 361/761 |
| 7,557,890 B2 | 7/2009 | Sakama et al. | |
| 2005/0018505 A1 | 1/2005 | Wallace | |
| 2006/0043583 A1 | 3/2006 | Tamagawa et al. | |
| 2007/0141760 A1 | 6/2007 | Ferguson et al. | |

FOREIGN PATENT DOCUMENTS

| | | |
|---|---|---|
| CN | 101017534 A | 8/2007 |
| EP | 1755073 A2 | 2/2007 |
| JP | 10-193848 A | 7/1998 |
| JP | 2002-049901 A | 2/2002 |
| JP | 2002-83925 A | 3/2002 |
| JP | 2006-53234 A | 2/2006 |
| WO | WO-2007-088757 A1 | 8/2007 |

OTHER PUBLICATIONS

European Search Report dated Feb. 5, 2009, issued in corresponding European Patent Application No. 08160980.2.
Chinese Office Action dated Apr. 14, 2010, issued in corresponding Chinese Patent Application No. 2008-10213010.8.
European Office Action, dated Jan. 12, 2011 for corresponding European Application No. 08160980.2.
Japanese Office Action mailed Jun. 26, 2012 for corresponding Japanese Application No. 2007-279346, with English-language Translation.

* cited by examiner

*Primary Examiner* — Jennifer Mehmood
*Assistant Examiner* — John Mortell
(74) *Attorney, Agent, or Firm* — Fujitsu Patent Center (57) ABSTRACT

The RFID tag has a base sheet having a recess, a first element provided on the base sheet astride the recess, a second element which is provided between the first element and the base sheet and which is electrically connected to the first element, and a communication antenna which is provided on the base sheet and which is connected to at least any of the first element and the second element.

2 Claims, 7 Drawing Sheets

RFID TAG AND MANUFACTURING METHOD THEREOF

BACKGROUND OF THE INVENTION

1. Field of the Invention

The present invention relates to an RFID (Radio Frequency IDentification) tag through which information is exchanged with external equipment in a non-contact manner. The "RFID tag" used in the specification of the present application is called "radio IC tag" by persons skilled in the technical field of the application in some cases.

2. Description of the Related Art

Conventionally, there are various known RFID (Radio Frequency IDentification) tags through which information is exchanged with external equipment in a non-contact manner utilizing radio wave. As one kind of such RFID tags, there is proposed a tag having an IC chip and a radio wave communication conductive pattern (antenna pattern) provided on a base sheet. The RFID tag of such a type can be utilized in such a manner that the RFID tag is pasted on electronic equipment, information concerning the electronic equipment is exchanged with external equipment, thereby identifying individual electronic equipment. Recently, like an RFID tag (see Japanese Patent Application Publication No. 10-193848 for example) in which an IC chip having a communication function and an IC chip having an analyzing function for analyzing information transmitted through radio wave are pasted through an electric conductor (anisotropic electric conductor) having conductivity only in one direction, there is proposed an RFID tag having laminated IC chips.

Incidentally, there are the demands for reduction in size, weight and cost of the RFID tag. It is preferable that a structure of the RFID tag is simple and the tag can be manufactured with a simple technique. According to the RFID tag of the Japanese Patent Application Publication No. 10-193848, it is necessary to interpose an anisotropic electric conductor between the two IC chips when the two IC chips are laminated on each other. Thus, the RFID tag has a drawback that the thickness of the entire RFID tag is increased. According to the RFID tag of the Japanese Patent Application Publication No. 10-193848, as it is necessary to electrically connect the two IC chips to each other through a special member, i.e., the anisotropic electric conductor, it is not so easy to realize a desired conductive state.

Thus, according to the RFID tag of the Japanese Patent Application Publication No. 10-193848, it is difficult to reduce the size, weight and cost of the tag.

SUMMARY OF THE INVENTION

In view of the above circumstances, the present invention provides an RFID tag having electron elements which has a simple structure and which can be manufactured with a simple technique, and provides a manufacturing method of the RFID tag.

The present invention has been made in view of the above circumstances and provides an RFID tag including a base sheet having a recess, a first element provided on the base sheet astride the recess, a second element which is provided between the first element and the base sheet and which is electrically connected to the first element, and a communication antenna which is provided on the base sheet and which is connected to at least any of the first element and the second element.

According to the RFID tag of the present invention, the first element is disposed astride the recess of the base sheet, and the second element is disposed between the first element and the base sheet. The communication antenna is connected to at least any of the first element and the second element. According to the RFID of the present invention, the two elements are superposed at the recess of the base sheet, which eliminates the need of a member such as an electric conductor between the two elements in the thickness direction of the RFID tag. Thus, the thickness of the RFID tag is reduced, and the RFID of the present invention is an RFID tag suitable for miniaturization. Further, since the structure of the RFID tag of the present invention is extremely simple, the RFID tag can be manufactured with a simple technique, and a cost thereof can be reduced.

In the RFID tag of the present invention, an embodiment in which the "the second element is physically fixed to the first element" is preferable.

If the first element and the second element are physically combined into one, it is possible to handle the first element and the second element as one element, and it becomes easy to manufacture the RFID tag.

In the RFID tag of the present invention, and in the RFID tag of the present invention in which the first element and the second element are physically fixed together, an embodiment in which "the second element is directly and electrically connected to the first element" is preferable.

According to this embodiment, if the second element is directly and electrically connected to the first element, electrical conduction between the second element and the first element is more reliably maintained.

In the RFID tag of the present invention, and in the RFID tag of the present invention in which the first element and the second element are physically fixed together, it is preferable to include a conductive pattern which is provided in the recess, and which electrically connects the second element to the first element.

According to this embodiment, a state where the first element and the second element are electrically connected with each other is easily realized.

According to another aspect of the present invention, a first manufacturing method of an RFID tag includes:

a first mounting process of mounting a second element smaller than a first element on a conductive pattern formed on a surface of a heat-softening base sheet, thereby causing the second element to be connected to the conductive pattern, the conductive pattern electrically connecting the first element with the second element each other, the base sheet further having a communication antenna formed on the surface thereof;

a recess forming process of heating the base sheet mounted with the second element, forming a recess in a portion of the base sheet where the second element is mounted; and a second mounting process of mounting the first element on the conductive pattern astride the recess of the base sheet and the second element, thereby connecting the first element to the conductive pattern, wherein at least any of the first mounting process and the second mounting process is a process in which at least any of the first element and the second element is mounted to be connected to the antenna on the base sheet.

According to the first manufacturing method of the RFID tag of the present invention, a portion of the base sheet where the second element is mounted is recessed by heating the same to form the recess, and the first element is disposed astride the recess of the base sheet. Only with this, a thin RFID tag is manufactured. According to the first manufacturing method of the RFID tag of the present invention, since the manufacturing method is carried out by such a simple technique, the first manufacturing method of the RFID tag of the present invention is suitable for reducing the cost.

According to another aspect of the present invention, a second manufacturing method of an RFID tag includes:

a recess forming process of heating a heat-softening base sheet that has a communication antenna formed on a surface of the base sheet, the communication antenna having a connection portion to be connected to an element, and of forming a recess in part of the connection portion;

a fixing process of physically fixing a first element and a second element smaller than the first element to each other;

a mounting process of mounting the mutually fixed first element and second element on the base sheet such that the second element fits in the recess, and of connecting at least any of the first element and the second element to the antenna on the base sheet; and a connecting process of electrically connecting the first element with the second element each other.

According to the second manufacturing method of the RFID tag of the present invention, the base sheet is recessed by heating the same to form the recess, the physically mutually fixed first element and second element are electrically connected with each other. Only with this, a thin RFID tag is manufactured. According to the second manufacturing method of the RFID tag of the present invention, since the manufacturing method is carried out by such a simple technique, the second manufacturing method of the RFID tag of the present invention is also suitable for reducing the cost.

In the second manufacturing method of the RFID tag of the present invention, an embodiment in which "the base sheet is also provided with a conductive pattern which electrically connects the first element and the second element with each other, and the connecting process also functions as the mounting process of mounting the mutually fixed first element and second element on the conductive pattern on the base sheet, thereby electrically connecting the first element and second element with each other" is preferable.

According to this embodiment, only by mounting the first element and the second element on the conductive pattern, the first element and the second element are electrically connected with each other. Therefore, the manufacturing method of the RFID tag is simplified.

In the second manufacturing method of the RFID tag of the present invention, an embodiment in which "the connecting process also functions as the fixing process of electrically connecting the first element and the second element with each other, and physically fixing them to each other" is preferable.

According to this embodiment, in the connecting process, since the first element and the second element are mutually electrically connected and physically fixed together, it is possible to handle the first element and the second element as one element, and the manufacturing method of the RFID tag is simplified.

According to the present invention, an RFID tag having electron elements which has a simple structure and which can be manufactured with a simple technique is realized.

DETAILED DESCRIPTION OF THE INVENTION

Embodiments of the present invention will be explained with reference to the drawings.

Figure 1:
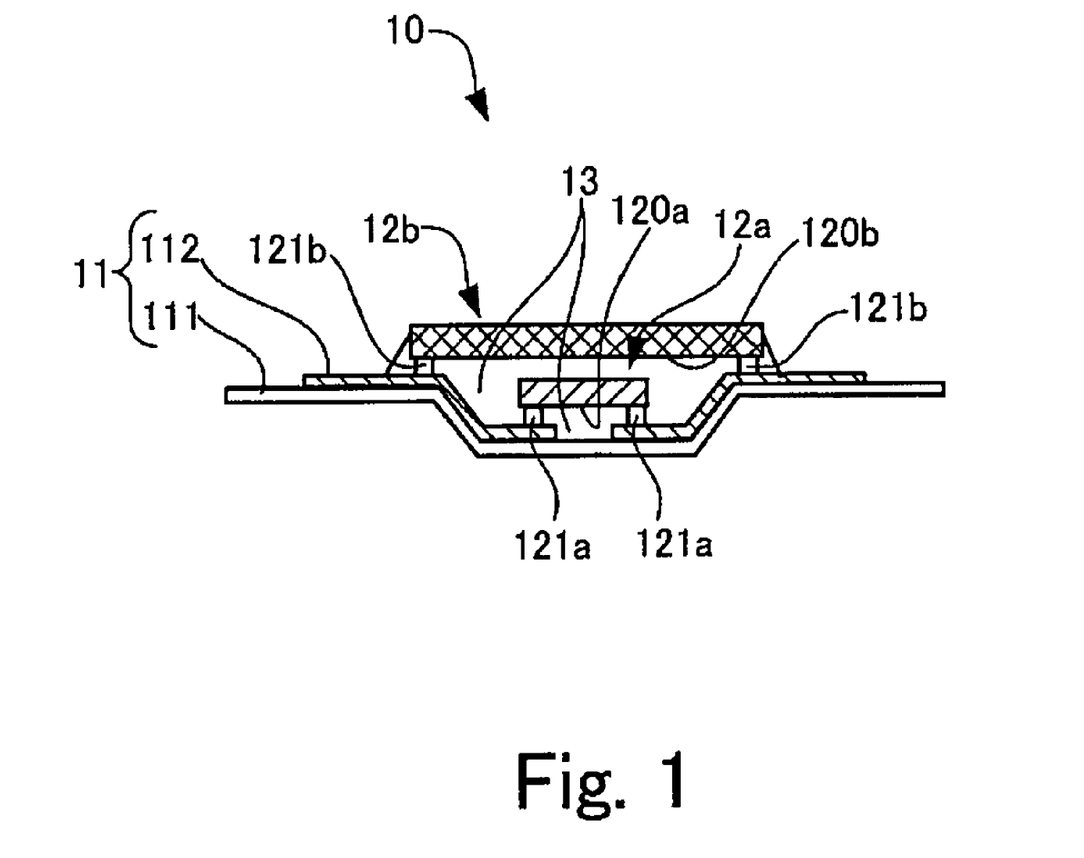
FIG. 1 is a diagram showing a schematic structure of an RFID tag according to an embodiment of an RFID tag of the present invention.
Figure 2:
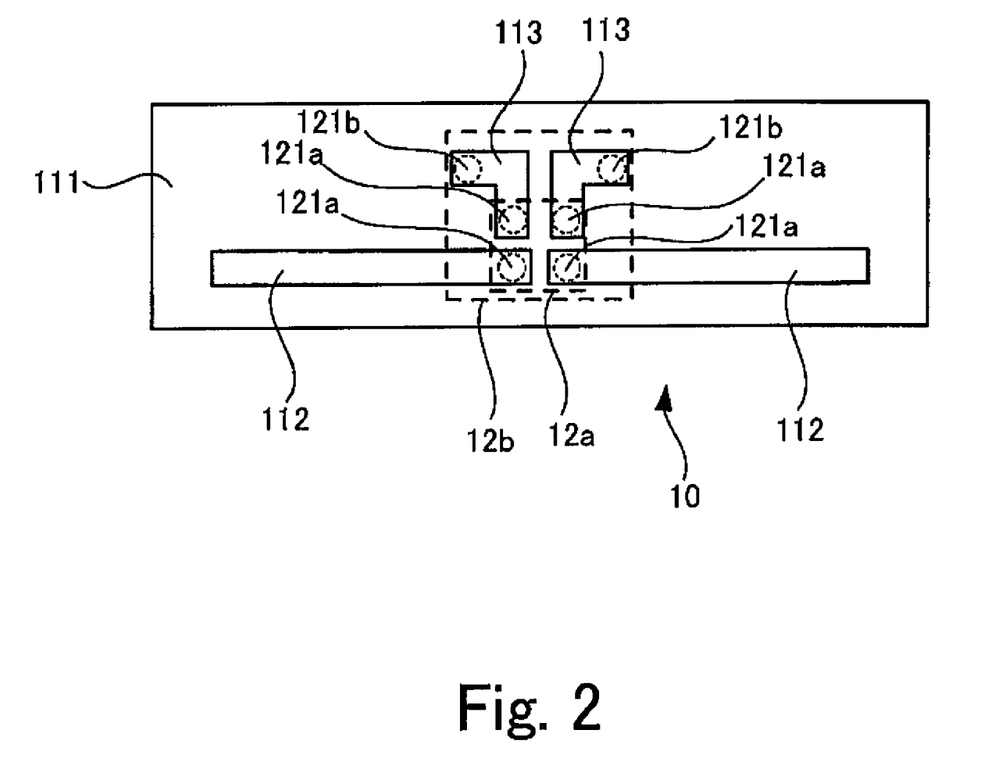
FIG. 2 is a diagram showing a state of wiring in the RFID tag in FIG. 1.

FIG. 1 is a diagram showing a schematic structure of an RFID tag 10 according to an embodiment of an RFID tag of the present invention. FIG. 2 is a diagram showing a state of wiring in the RFID tag 10.

The RFID tag 10 shown in FIG. 1 is an electronic apparatus which exchange information in a non-contact manner with a reader/writer (not shown) utilizing radio wave. The "RFID tag" used in the specification of the present application may be called "RFID tag inlay" by persons skilled in the technical field of the application in some cases because it is an inlay for the "RFID tag." The "RFID tag" may also be called "radio IC tag" in some cases. The "RFID tag" includes a non-contact type IC card.

FIG. 1 shows a schematic structure of the RFID tag 10 as viewed from the side of the RFID tag 10. The RFID tag 10 includes a base body 11 in which a metal antenna pattern 112 is formed on a resin film 111. Two IC chips 12a and 12b are placed on the base body 11 such that the IC chip 12b overlaps the IC chip 12a. The two IC chips 12a and 12b include circuit faces 120a and 120b formed with electronic circuits. The lower one (12a) of the two IC chips 12a and 12b shown in FIG. 1 is smaller than the upper one (12b) shown in FIG. 1. In the following description, to distinguish the two IC chips 12a and 12b, the lower IC chip 12a in FIG. 1 is called the small chip 12a, and the upper IC chip 12b in FIG. 1 is called the large chip 12b.

The resin film 111 corresponds to one example of the base sheet mentioned in the present invention, the large chip 12b corresponds to one example of the first element mentioned in the present invention, and the small chip 12a corresponds to one example of the second element mentioned in the present invention.

As shown in FIG. 1, the base body 11 includes a downwardly recessed shape in FIG. 1, and the small chip 12a is disposed in the recessed portion (recess) in a state where the circuit face 120a of the small chip 12a is oriented toward the base body 11. As shown in FIG. 1, the antenna pattern 112 extends to the recessed face of the recess along the surface of the base body 11, the antenna pattern 112 in the recessed face is connected to bumps 121a provided on the circuit face 120a of the small chip 12a. With this, the antenna pattern 112 and the small chip 12a are in conduction with each other.

On the other hand, as shown in FIG. 1, the large chip 12b is disposed on the base body 11 astride the recess. In this state, two bumps 121b provided on the circuit face 120b of the large chip 12b are located on edges of the recess of the base body 11, respectively. Although it is not illustrated in this drawing, the large chip 12b is electrically connected to the small chip 12a.

The small chip 12a is adhered to the base body 11 by an adhesive 13, and the large chip 12b is also adhered to the base body 11 by the adhesive 13 with the small chip 12a interposed therebetween. The adhesive 13 is thermosetting adhesive. As described below, in the manufacturing procedure of the RFID tag 10, the liquid adhesive 13 is heated and hardened.

FIG. 2 shows a state of wiring between the small chip 12a, the large chip 12b and the antenna patterns 112 on a lateral plane of FIG. 1. As shown in FIG. 2, the two antenna patterns 112 extending in the lateral direction in the drawing are connected to a lower left bump 121a and a lower right bump 121a in the drawing of four bumps 121a of the small chip 12a. Remaining upper left bump 121a and upper right bump 121a in the drawing are connected to bumps 121b of the large chip 12b through the connecting wires 113. With such a structure, both electric conduction between the antenna pattern 112 and the small chip 12a and electric conduction between the large chip 12b and the small chip 12a are realized. Here, the connecting wire 113 corresponds to one example of the conductive pattern mentioned in the present invention.

In the RFID tag 10, the reader/writer generates radio wave received by the antenna pattern 112, and the large chip 12b and the small chip 12a are driven based on the radio wave. Electricity which becomes driving source of the large chip 12b and the small chip 12a is also obtained from the radio wave, and the RFID tag 10 does not require a built-in power supply such as a battery, and the RFID tag is suitable to reduce its size and weight.

In the RFID tag 10, the small chip 12a is disposed in the recessed portion of the base body 11 such that the small chip 12a is just fitted therein, and the large chip 12b is superposed on the small chip 12a and is disposed on the base body astride the recess. According to the RFID tag of the present invention, the small chip 12a and the large chip 12b are superposed on each other at the recessed portion of the base body 11 as described above, eliminating an additional electric conductor or the like between the two chips in the thickness direction of the RFID tag. This makes the thickness of the entire RFID tag thin, thereby making the RFID tag of the present invention suitable in terms of reduction in size and weight.

A manufacturing method of the RFID tag 10 will be explained below.

Figure 3:
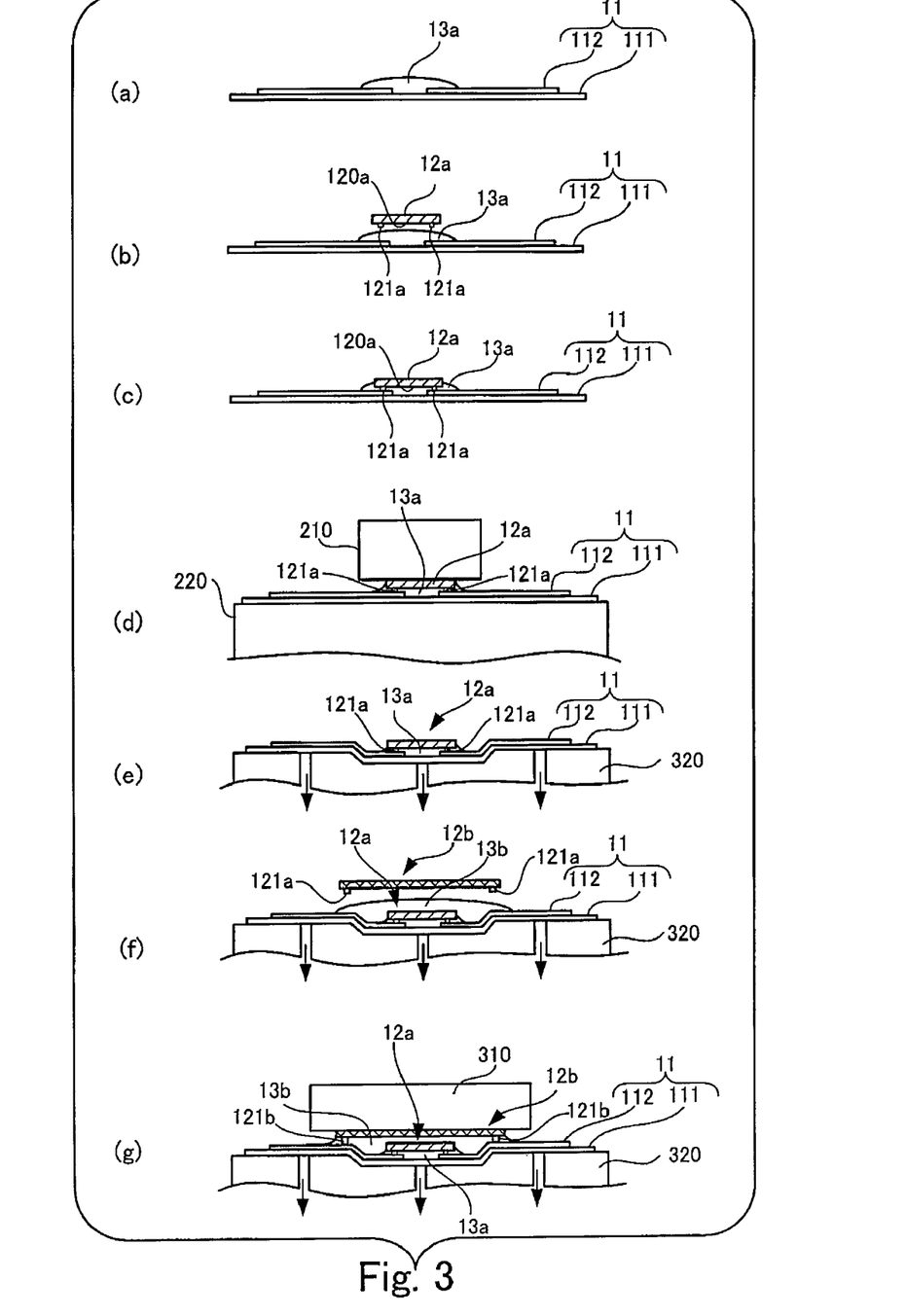
FIG. 3 are diagrams illustrating a manufacturing method for manufacturing the RFID tag shown in FIG. 1.

FIG. 3 is a diagram for explaining one embodiment of the manufacturing method of manufacturing the RFID tag 10 shown in FIG. 1. Part (a)-Part (g) of FIG. 3 sequentially show the steps of manufacturing the RFID tag 10.

To manufacture the RFID tag 10, in an adhering process shown in Part (a) of FIG. 3, the base body 11 in which a resin film 111 is formed with the antenna pattern 112 and the connecting wires 113 (not shown in FIG. 3) shown in FIG. 2 are formed is prepared, and a liquid adhesive 13a is adhered to a face of the base body 11 on which the antenna pattern 112 is formed. The adhesive 13a is a thermosetting adhesive which is hardened when it is heated. The adhesive 13a shown in Part (a) of FIG. 3 is the same as the adhesive 13 shown in FIG. 1, but since there are two processes of adhering the adhesive 13 in the manufacturing procedure of the RFID tag 10 as will be described later, the adhesive is designated with different symbols to distinguish the two processes.

Next, in a small chip mounting step shown in Parts (b) and (c) of FIG. 3, the small chip 12a is placed on a portion of the base body 11 where the adhesive 13a is adhered in such a state where the circuit face 120a of the small chip 12a faces the base body 11. At that time, the small chip 12a is positioned such that the bumps 121a provided on the circuit face 120a of the small chip 12a are aligned with the antenna pattern 112 of the base body 11 and the connecting wire 113 (see FIG. 2, not shown in FIG. 3) shown in FIG. 2.

Next, in a first adhering step shown in Part (d) of FIG. 3, the base body 11 on which the small chip 12a is placed is put on a heating stage 220, the small chip 12a on the base body 11 is pressed toward the heating stage 220 by a first heating head 210 having a heater therein and in this state, the small chip 12a is heated. By this heating operation, the adhesive 13a under the small chip 12a is hardened, and the small chip 12a is fixed onto the base body 11. By this heating operation, the film 111 constituting the base body 11 is softened.

Next, in a recess forming step shown in Part (e) of FIG. 3, a stepped stage 320 has a stepped recess which becomes a mold for forming a recess in the base body 11, and the base body 11 obtained by softening the film 111 in the first adhering step (see Part (d) of FIG. 3) is set on the stepped stage 320 such that a portion of the base body 11 on which the small chip 12a is placed fits in the recess. In this state, air is sucked from a suction hole formed in the stepped stage 320. With this, the set base body 11 is just pasted on the stepped stage 320. After predetermined time is elapsed, the film 111 is cooled and hardened, and the base body 11 is provided with a recess.

Next, in a large chip mounting step shown in Part (f) of FIG. 3, liquid adhesive 13b is adhered onto the base body 11 provided with the recess such that the adhesive 13b surround the small chip 12a on the base body 11. The large chip 12b is mounted on a portion of the base body 11 where the adhesive 13b is adhered astride the recess of the base body 11. The adhesive 13b is thermosetting adhesive which is hardened if it is heated. The adhesive 13b is the same as the adhesive 13 shown in FIG. 1. When the large chip 12b is mounted, the position of the large chip 12b is determined such that the bump 121b on the circuit face 120b of the large chip 12b is connected to the connecting wire 113 shown in FIG. 2.

Next, in a second adhering step shown in Part (g) of FIG. 3, the large chip 12b mounted on the base body 11 is pressed toward the stepped stage 320 using a second heating head 310 having a heater therein and in this state, the large chip 12b is heated. By this heating operation, the adhesive 13b under the large chip 12b is hardened, the large chip 12b is fixed onto the base body 11, and the RFID tag 10 shown in FIG. 1 is completed.

According to the manufacturing method of the RFID tag shown in FIG. 3, the portion of the base body 11 on which the small chip 12a is mounted is caused to form the recess by being heated, and the large chip 12b is disposed astride the recess. Only with this, a thin RFID tag is manufactured. Since the manufacturing method of RFID tags shown in FIG. 3 can be carried out with such a simple technique and thus, this method is suitable for cost reduction.

In the above manufacturing method, the large chip 12b is superposed on the small chip 12a and fixed onto the base body 11 after the small chip 12a is fixed onto the base body 11, but the RFID tag 10 can also be manufactured by a manufacturing method in which the large chip 12b is superposed on the small chip 12a and fixed thereto and then, these two IC chips are fixed on the base body 11 collectively. Such a manufacturing method will be explained below.

Figure 4:
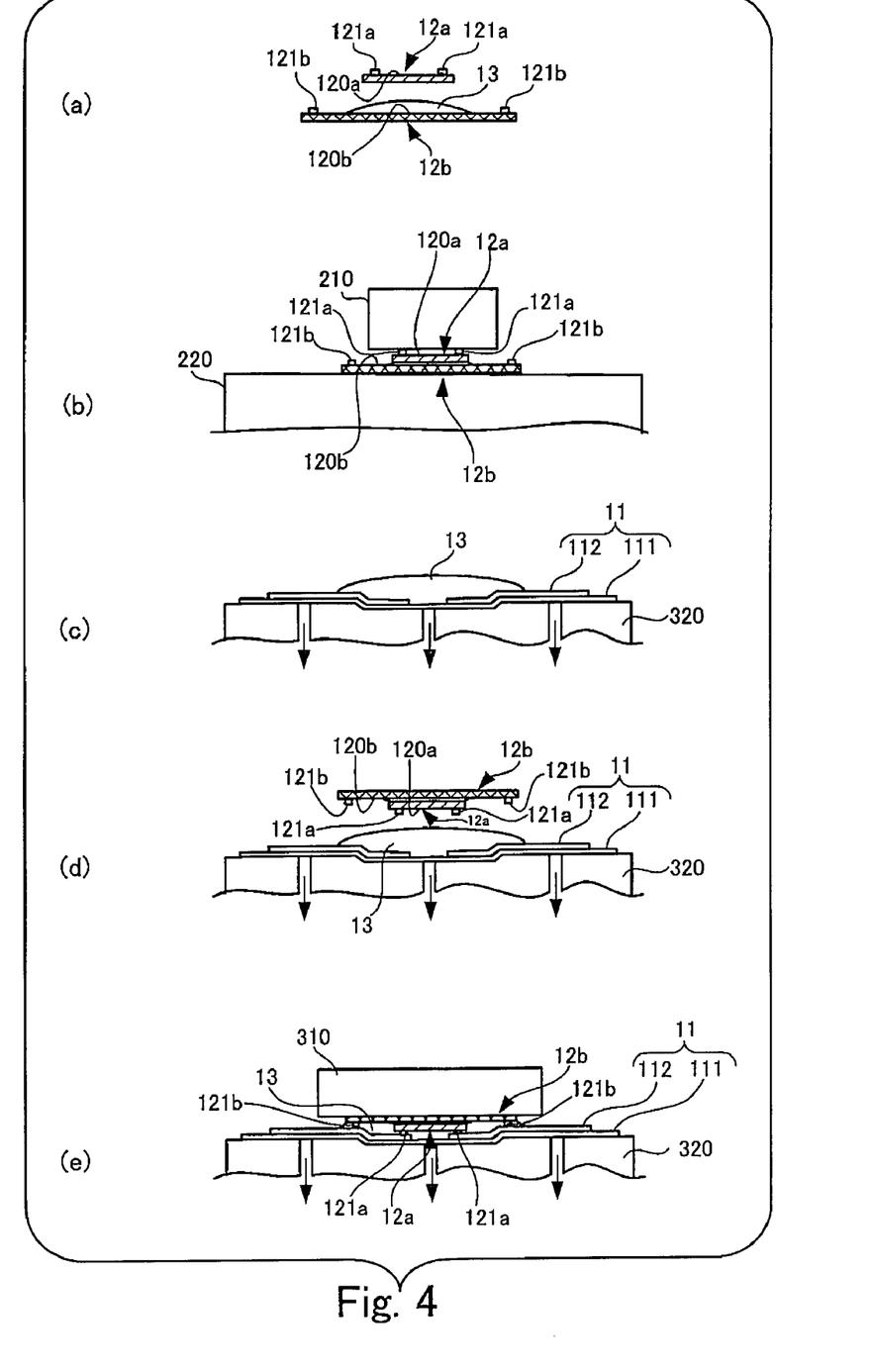
FIG. 4 are diagrams illustrating another manufacturing method of the RFID tag shown in FIG. 1 that is different from that in FIG. 3.

FIG. 4 is a diagram for explaining another manufacturing method of the RFID tag 10 shown in FIG. 1 that is different from the method shown in FIG. 3.

The manufacturing method shown in FIG. 4 is a second embodiment of the manufacturing method of the RFID tag of the present invention. Part (a) to Part (e) of FIG. 4 sequentially shows steps of the manufacturing method which is different from the manufacturing method of the RFID tag 10 shown in FIG. 3.

In the manufacturing method shown in FIG. 4, in a chip adhering step shown in Part (a) of FIG. 4, the small chip 12a is disposed on the liquid adhesive 13 adhered to the circuit face 120b of the large chip 12b in a state where a face of the small chip 12a opposite from the circuit face 120a is oriented toward the circuit face 120b of the large chip 12b.

Next, in a first adhering step shown in Part (b) in FIG. 4, the large chip 12b on which the small chip 12b is placed through the adhesive 13b is set on the heating stage 220 such that a face of the large chip 12b opposite from the circuit face 120b is oriented toward the heating stage 220. The first heating head 210 presses the small chip 12a on the circuit face 120a of the large chip 12b toward the heating stage 220 and in this state the first heating head 210 heats the small chip 12a. By this heating operation, the adhesive 13 under the small chip 12a is hardened, and the small chip 12a is fixed onto the circuit face 120b of the large chip 12b.

Next, in a recess forming step shown in Part (c) of FIG. 4, the base body 11 in which the antenna pattern 112 and the connecting wire 113 shown in FIG. 2 is formed on the film 111 is prepared, the film 111 is heated and softened, and the base body 11 having the softened film 111 is set onto the stepped stage 320 having a stepped recess. The base body 11 is set such that the film side of the base body 11 comes into contact with the stepped stage 320 as shown in Part (c) of FIG. 4. In this state, air is sucked from the suction hole formed in the stepped stage 320, and the base body 11 is just pasted on the stepped stage 320. After predetermined time is elapsed, the film 111 is cooled and hardened, and the base body 11 is provided with the recess. Then, the liquid adhesive 13 is adhered to the recess of the base body 11.

Next, in a chip mounting step shown in Part (d) of FIG. 4, the large chip 12b and the small chip 12a which are adhered to each other in the chip adhering step in Part (a) of FIG. 4 and the first adhering step in Part (b) of FIG. 4 are placed on a portion of the base body 11 where the adhesive 13 is applied, in such a way that the circuit face 120b of the large chip 12b and the circuit face 120a of the small chip 12a face the stepped stage 320. At that time, positions of the large chip 12b and the small chip 12a are determined such that the bumps 121a provided on the circuit face 120a of the small chip 12a are aligned with the antenna patterns 112 of the base body 11 and the connecting wires 113 (not shown in FIG. 3) shown in FIG. 2, and the bumps 121b provided on the circuit face 120b of the large chip 12b are aligned with the connecting wires 113.

Next, in a second adhering step shown in Part (e) of FIG. 4, the large chip 12b and the small chip 12a mounted on the base body 11 are pressed by the second heating head 310 having a heater therein toward the stepped stage 320 and in this state, the large chip 12b and the small chip 12a are heated. With this heating operation, the large chip 12b, the small chip 12a and the adhesive 13 between the base body 11 and the chips 12a and 12b are hardened, the large chip 12b and the small chip 12a are fixed onto the base body 11, and the RFID tag 10 shown in FIG. 1 is completed.

In the above manufacturing method of the RFID tag shown in FIG. 4, the base body 11 is heated and recessed to form the recess, the physically mutually fixed large chip 12b and small chip 12a are electrically connected to each other through the connecting wire 113 with the recess. Only with this, a thin RFID tag is manufactured. Since the manufacturing method of the RFID tag shown in FIG. 4 is carried out with such a simple technique, this manufacturing method is suitable for cost reduction.

According to the RFID tag 10, the antenna pattern 112 extends to the recessed face of the recess of the base body 11 and the antenna pattern 112 is connected to the small chip 12a in the recess as shown in FIGS. 1 and 2, but the RFID tag of the present invention may be constituted such that the antenna pattern may extend to an opening of the recess of the base body and may be connected to the large chip 12b. The latter RFID tag in which the antenna pattern is connected to the large chip has the same structure as the RFID tag 10 shown in FIG. 1 except that the antenna pattern extends to the opening of the recess of the base body and the antenna pattern is connected to the large chip 12b. Description of the schematic structure of the RFID tag is omitted, focusing on description of wiring of the RFID tag in which the antenna pattern is connected to the large chip 12b.

Figure 5:
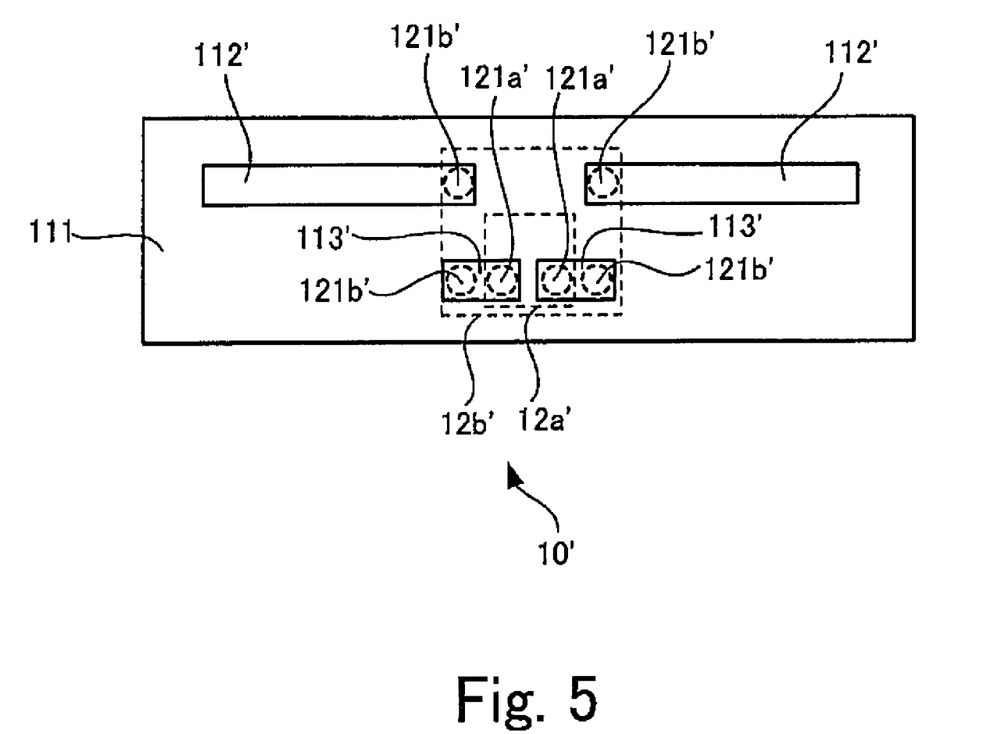
FIG. 5 is a diagram showing a state of wiring in the RFID tag wherein an antenna pattern is connected to a large chip.

FIG. 5 shows a state of wiring of the RFID tag in which the antenna pattern is connected to the large chip 12b.

In an RFID tag 10' shown in FIG. 5, antenna patterns 112' on the film 111 are connected to a large chip 12b' through bumps 121b', and are not connected to a small chip 12a'. On the other hand, bumps 121a' of the small chip 12a, and a lower right bump 121b' and a lower left bump 121b' of the large chip 12b are connected to each other through connecting wires 113', and electric conduction exists between the small chip 12a and the large chip 12b by the connecting wires 113'. The RFID tag 10' in which the antenna patterns 112' are connected to the large chip 12b in this manner is another embodiment of the RFID tag of the present invention. The RFID tag 10' is manufactured by the same manufacturing method as that explained with reference to FIGS. 3 and 4 except that the antenna pattern 112' and the wiring pattern 113' on the base body have different pattern shapes from those of the antenna pattern 112 and the wiring pattern 113 of the RFID tag 10 shown in FIG. 2.

According to each of the RFID tag 10 and 10', the small chip is connected to the connecting wire on the base body such that the circuit face of the small chip is oriented toward the base body, and the small chip is electrically connected to the large chip through the connecting wire, but in the RFID tag of the present invention, the small chip may be in conduction directly with the large chip. An RFID tag in which the small chip is in conduction directly with the large chip will be described below. This RFID tag is another embodiment of the RFID tag of the present invention.

Figure 6:
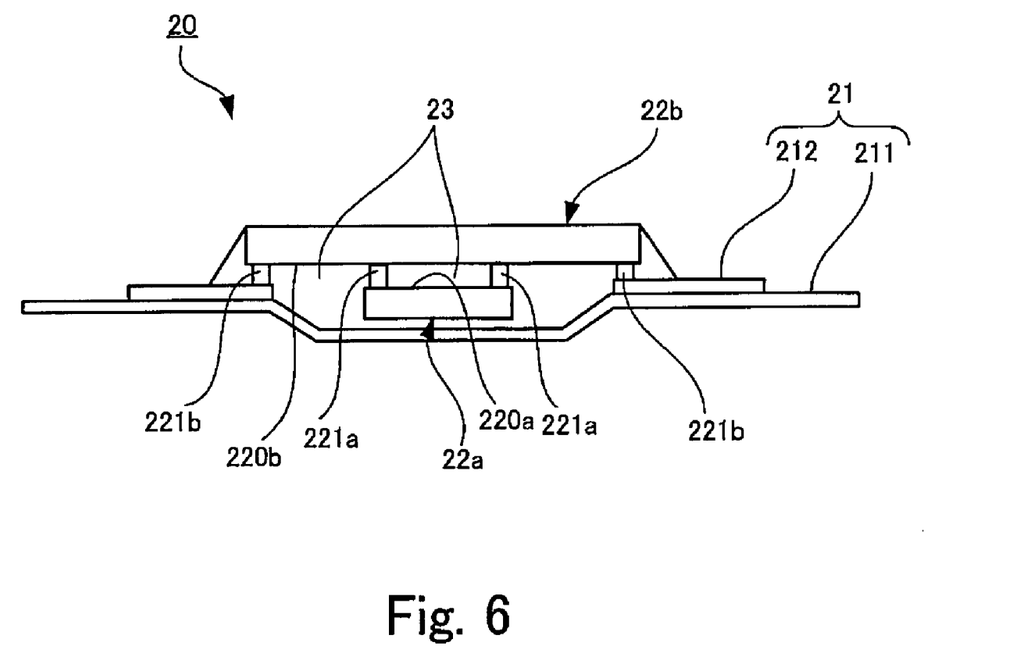
FIG. 6 is a diagram showing a schematic structure of an RFID tag according to another embodiment of the RFID tag of the present invention.
Figure 7:
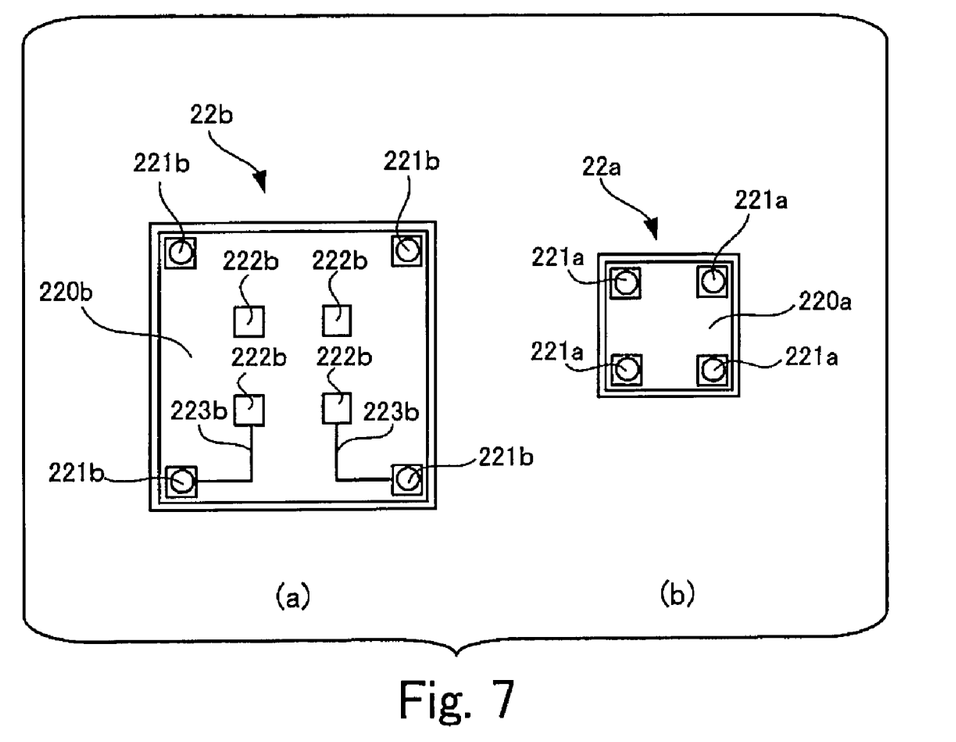
FIG. 7 are diagrams showing a state of wiring of the large chip and a small chip in the RFID tag shown in FIG. 6.

FIG. 6 is a diagram showing a schematic structure of an RFID tag 20 according to another embodiment of the RFID tag of the present invention. FIG. 7 is a diagram showing wiring states of a large chip 22b and a small chip 22a in the RFID tag 20.

The RFID tag 20 shown in FIG. 6 has a base body 21 in which a metal antenna pattern 212 is formed on a resin film 211, and two IC chips of the mutually electrically connected small chip 22a and large chip 22b are placed on the base body 21 such that the large chip 22b is superposed on the small chip 22a as shown in the figure.

On the other hand, as shown in FIG. 6, the base body 21 has a shape recessed downward in FIG. 6, and a small chip 22a is disposed in the recessed portion (recess) in such a state that a circuit face 120a formed with an electronic circuit is oriented toward the large chip 22b. On the other hand, the large chip 22b also includes a circuit face 220b formed with an electronic circuit, and bumps 221a provided on the circuit face 220a of the small chip 22a is connected to pads (see FIG. 7) provided on the circuit face 220b of the large chip 22b.

As shown in FIG. 6, two bumps 221b provided on the circuit face 220b of the large chip 22b are disposed in edges of the recess of the base body 21 and with this, the large chip 22b is disposed on the base body 21 astride the recess. The antenna pattern 212 of the base body 21 extends to an opening of the recess along the surface of the base body 21, and the antenna pattern 212 near the opening is connected to the bumps 221b of the large chip 22b.

Adhesives which are heated to be hardened exist between the small chip 22a and the large chip 22b and between the large chip 22b and the base body 21. With the adhesives, the small chip 22a is adhered to the large chip 22b and the large chip 22b is adhered to the base body 21.

FIG. 7 shows wiring states of the circuit face 220b of the large chip 22b and the circuit face 220a of the small chip 22a. Here, of four bumps 221b in the circuit face 220b of the large chip 22b shown in Part (a) of FIG. 7, an upper left bump 221b and an upper right bump 221b in FIG. 7 are connected to the antenna pattern 212 shown in FIG. 6, and remaining lower left and right bumps 221b in FIG. 6 are connected, through connection lines 223b, two of four pads 222b located around a center of the circuit face 220b of the large chip 22b as shown in Part (a) of FIG. 7.

On the other hand, as shown in Part (b) of FIG. 7, the circuit face 220a of the small chip 22a is provided with four bumps 221a, and the bumps 221a are connected to the four pads 222b of the large chip 22b, respectively, in the mode shown in FIG. 6. With this, a state where electric conduction exists between the large chip 22b and the small chip 22a is realized.

The RFID tag 20 shown in FIG. 6 is manufactured in the same manufacturing method as that shown in FIG. 4 except that the small chip 22a is mounted on the large chip 22b in the direction vertically opposite to the direction in which the small chip 12a of the RFID tag 10 shown in FIG. 1 is mounted. Especially in the manufacturing method of the RFID tag 20 shown in FIG. 6, when the small chip 22a is mounted to the large chip 22b in Part (a) of FIG. 4, electric conduction is realized at the same time between the small chip 22a and the large chip 22b as explained with reference to FIG. 7. Thus, it is possible to handle the small chip 22a and the large chip 22b as one chip, and the manufacturing method of the RFID tag is simplified.

The above describes the embodiments of the present invention.

Although the RFID tag having two superposed IC chips has been described above, the RFID tag may have three or more laminated IC chips. In this case, two or more IC chips may be accommodated in the recess of the base body.

What is claimed is:

1. A manufacturing method of an RFID tag comprising:
    forming a conductive pattern and a communication antenna on a surface of a heat-softening base sheet;
    mounting a second semiconductor element on the conductive pattern, with a thermosetting adhesive sandwiched therebetween;
    heating the heat-softening base sheet mounted with the second semiconductor element, to harden the thermosetting adhesive and to form, by the heating to harden the thermosetting adhesive, a recess having a greater dimension than the second semiconductor element in a portion of the base sheet where the second semiconductor element is mounted;
    mounting a first semiconductor element having a greater dimension than the recess astride the recess of the base sheet;
    connecting the first semiconductor element to the conductive pattern; and
    connecting at least any of the first semiconductor element and the second semiconductor element to the communication antenna on the base sheet.

2. The manufacturing method of the RFID tag according to claim 1, wherein a plurality of bumps of the first semiconductor element are located outside the recess.

* * * * *